(12) United States Patent
Soumyanath et al.

(10) Patent No.: US 6,703,878 B2
(45) Date of Patent: Mar. 9, 2004

(54) INPUT JITTER ATTENUATION IN A PHASE-LOCKED LOOP

(75) Inventors: Krishnamurhty Soumyanath, Portland, OR (US); Ashoke Ravi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 10/206,778

(22) Filed: Jul. 25, 2002

(65) Prior Publication Data

US 2004/0017261 A1 Jan. 29, 2004

(51) Int. Cl.[7] .............................. H03L 7/00; H03C 3/00
(52) U.S. Cl. ........................ 327/157; 327/156; 331/16; 331/1 A
(58) Field of Search ................................ 327/156, 157, 327/158, 105, 141; 331/16, 18

(56) References Cited

U.S. PATENT DOCUMENTS 5,677,743 A * 10/1997 Terao et al. ................. 348/735
6,008,703 A * 12/1999 Perrott et al. ................. 331/16
6,249,189 B1 * 6/2001 Wu et al. ....................... 331/18

* cited by examiner

Primary Examiner—Dinh T. Le
(74) Attorney, Agent, or Firm—Fish & Richardson P.C.

(57) ABSTRACT

To attenuate the effects of phase noise and input jitter introduced in the reference frequency of the PLL, the zeros of the forward path transfer function are removed. As a result, the forward path does not amplify any phase noise or input jitter appearing in the reference frequency. However, overall loop stability is maintained by placing the zeros in the feedback path of the PLL. A discriminator may be placed in the feedback path to introduce the zero in the loop gain transfer function and provide stability.

31 Claims, 5 Drawing Sheets

INPUT JITTER ATTENUATION IN A PHASE-LOCKED LOOP

TECHNICAL FIELD

This invention relates to phase-locked loops (PLLs), and more particularly to improving input jitter attenuation in PLLs.

BACKGROUND

PLLs are used in many communications systems because of their remarkable versatility. For example, a PLL may be used to perform frequency synthesis, tone decoding, signal modulation and demodulation, clock generation, and pulse synchronization. In addition, PLLs may be used in analog, digital, and hybrid analog/digital systems.

A conventional PLL includes a phase detector and a voltage-controlled oscillator (VCO). The phase detector compares the phase of a reference frequency and a feedback frequency (e.g., the output of the VCO), and generates an output that is a function of the phase difference (e.g., a phase-error signal). The phase-error signal is used to adjust the VCO's output frequency in the direction of the reference frequency. If conditions are right, the VCO locks to the reference frequency and maintains a fixed phase relation with the reference frequency.

In the simplest PLL, the phase detector may be connected directly to the VCO to form a first order loop (i.e., a loop that has a single pole in the closed loop transfer function). First order loops provide large phase margins; however, a first order loop's bandwidth and steady-state phase-error are undesirably coupled. Therefore, most PLLs include an integrator circuit, for example, a loop filter, that is connected between the phase detector and the VCO to form, for example, a second order PLL (i.e., a loop that has two poles).

A second order PLL provides a loop that has a high loop gain at low frequencies. The loop filter typically includes a capacitor that stores a voltage that is used to control the VCO. However, the second pole provided by the additional integrator circuit of the loop filter generates a 90° negative phase shift. The negative phase shift must be offset by a corresponding positive phase shift of a zero (i.e., a frequency that causes the loop transfer function to be zero) for the loop to remain stable. To provide an acceptable phase margin (i.e., the difference between 180° and the phase shift around the loop at the unity gain frequency), a resistor, for example, may be placed in series with the capacitor of the loop filter to introduce the zero and cause the loop filter to be a low pass filter.

The low pass loop filter is able to attenuate some high frequency noise in the loop. However, any input jitter or phase noise introduced in the reference frequency (e.g., by surrounding circuits and/or the coupling of the reference frequency source to the PLL) may be amplified by the loop filter. As a result, the amplified input jitter may appear in the output of the VCO, and, if large enough, may cause significant interference from the adjacent channel in a transceiver. Typically, a sufficiently large damping ratio is chosen to reduce the effect of input jitter in the PLL.

DESCRIPTION OF DRAWINGS

Like reference symbols in the various drawings indicate like elements.

DETAILED DESCRIPTION

Figure 1:
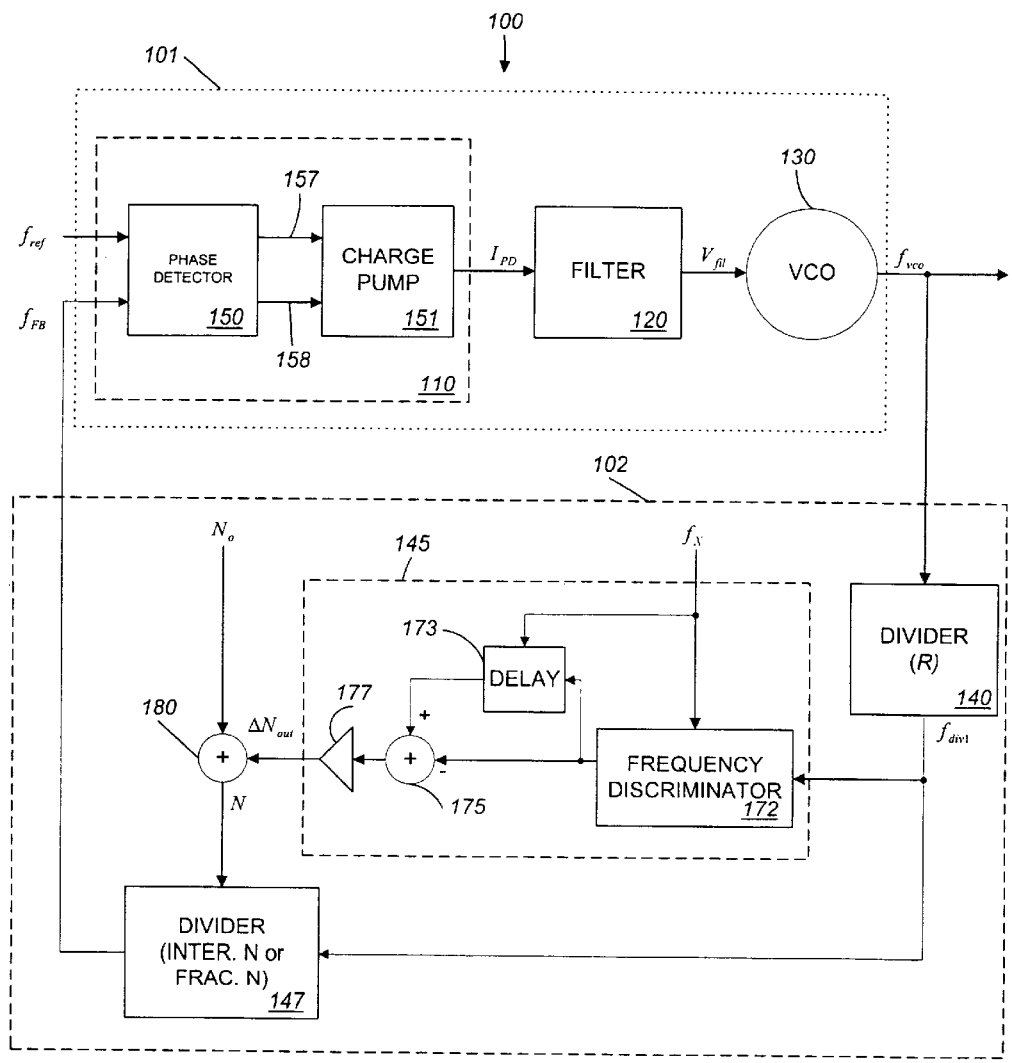
FIG. 1 is an exemplary block diagram of a PLL with zero in feedback path.

As shown in FIG. 1, an exemplary PLL 100 includes a forward path 101 and a feedback path 102. The forward path 101 may include a frequency-phase detector 110, a loop filter 120, and a VCO 130. The feedback path 102 may include a frequency divider 140, a discriminator block 145, and a frequency divider 147.

The frequency-phase detector 110 determines the relative phase difference between the edges of a reference frequency $f_{ref}$ (e.g., an input clock) and a feedback frequency $f_{FB}$, and generates a current $I_{PD}$ that is a function of the relative phase difference. The frequency-phase detector 110 may include a phase comparator 150 and a charge pump 151. The phase comparator 150 receives two inputs (i.e., the reference frequency $f_{ref}$ and the feedback frequency $f_{FB}$), and generates an output pulse on one of the lines 157 and 158 based on any difference between their phases. The width of the pulse is equal to the time between the respective edges of the reference frequency $f_{ref}$ and the feedback frequency $f_{FB}$. The phase comparator 150 generates pulses only if there is a phase-error. The pulses stop when the phase of the reference frequency $f_{ref}$ and the feedback frequency $f_{FB}$ are locked.

The pulses on lines 157 and 158 may be input to a charge pump 151. The charge pump 151 generates the current $I_{PD}$ to correct any phase-error resulting from the difference between the phase of the reference frequency $f_{ref}$ and the phase of the feedback frequency $f_{FB}$. The current $I_{PD}$ is input to the loop filter 120. In the frequency domain, the current input to the loop filter 120 may be expressed as $I_{PD}(s) = K_{PD}\theta_{PD}(s)$, where $K_{PD}$ is the gain constant of the phase frequency detector and $\theta_{PD}$ is the difference between the phase of the reference frequency $f_{ref}$ and the phase of the feedback frequency $f_{FB}$ (i.e., the phase-error).

The loop filter 120 outputs a VCO control voltage $V_{fil}$ that controls the frequency generated by the VCO 130. The loop filter 120 may include one or more capacitors (not shown) that store the VCO control voltage $V_{fil}$. In the Frequency domain, the VCO control voltage may be expressed as $V_{fil}(s) = I_{PD}(s)F(s)$ where $F(s)$ is the transfer function of the loop filter 120. In one implementation, the loop filter 120 does not contain any resistors in series with the one or more capacitors, and, therefore, does not introduce a zero in the forward path transfer function. As a result, the one or more capacitors may act as pure integrators.

If a phase-error occurs in the PLL 100, then the phase comparator 150 generates a short train of pulses that cause the charge pump 151 to charge or discharge the one or more capacitors of the loop filter 120. If the phase of the feedback frequency $f_{FB}$ lags behind the reference frequency $f_{ref}$, the phase comparator 150 outputs an up-pulse on the line 157. The up-pulse causes the charge pump 151 to charge the one or more capacitors of loop filter 120. If the phase of the feedback frequency $f_{FB}$ leads the reference frequency $f_{ref}$, then the phase comparator 150 generates a down-pulse on the line 158. The down-pulse causes the charge pump 151 to partially discharge current from the one or more capacitors of the loop filter 120. The changes to the voltage stored by the one or more capacitors adjust the VCO control voltage $V_{fil}$.

The VCO 130 outputs a frequency $f_{vco}$ that is a function of the VCO control voltage $V_{fil}$ received from the loop filter 120. In the frequency domain, the VCO output phase $\theta_{vco}$ may be expressed as $$\theta_{vco}(s) = K_{vco} \frac{V_{fil}(s)}{s},$$

where $K_{vco}$ is the gain constant of the VCO 130.

The output frequency $f_{VCO}$ is input to the feedback path 102. In particular, the VCO output frequency $f_{VCO}$ may be input to the frequency divider 140. The frequency divider 140 may be used as a pre-scaler to divide down the VCO output frequency $f_{VCO}$ by an integer R. The frequency divider 140 outputs the frequency $f_{div1}$, which may be input to the discriminator block 145 and the frequency divider 147. In the Frequency domain the frequency $f_{div1}$ may be expressed as $$f_{div1}(s) = \frac{f_{vco}(s)}{R}.$$

The block 145 may include a frequency discriminator 172, a delay unit 173, an adder 175, and an amplifier 177. The block 145 receives the frequency $f_{div1}$ and a reference frequency $f_x$, for example, a low frequency clock signal, as inputs. The block 145 outputs $\Delta N_{out}$, which is a component of the divider control signal N for divider 147.

The clock frequency $f_x$ is input to the frequency discriminator 172 and the delay unit 173. The frequency discriminator 172 (e.g., a frequency-to-voltage converter) compares the clock frequency $f_x$ and the frequency $f_{div1}$ to determine any difference between the frequencies. The frequency discriminator 172 generates an error voltage that is a function of the determined frequency difference. The error voltage is input to the delay circuit 173 and to the adder 175. The adder 175 determines the difference of the output of the frequency discriminator 172 and the delay circuit 173. The output of the adder 175 is input to inverter 177 to generate $\Delta N_{out}$. In the frequency domain, $\Delta N_{out}$ may be expressed as $$\Delta N_{out}(s) = \frac{K_d s \theta_{div1}(s)}{f_x},$$

where $K_d$ is the gain constant of the block 145.

The output $\Delta N_{out}$ from the block 145 is input to an adder 180 along with input $N_o$. The output N of the adder 180 is used to control the divider 147. N may be an integer if $N_o$ is set to a constant, or N may be a fraction if $N_o$ is the output of, for example, a delta sigma modulator (not shown).

The frequency divider 147 receives the output of the frequency divider 140 and divides the frequency $f_{div1}$ by N to generate the feedback frequency $f_{FB}$. The feedback frequency $f_{FB}$ is input to the frequency-phase discriminator 110 to determine any phase-error generated by the PLL 100 and to adjust the output frequency of the PLL 100 (if necessary). In the frequency domain, the feedback phase $\theta_{FB}$ may be expressed as $$\theta_{FB}(s) = \frac{\theta_{div1}(s)}{N_o} + \frac{2\pi \Delta N_{out}(s)}{N_o}.$$

Figure 2:
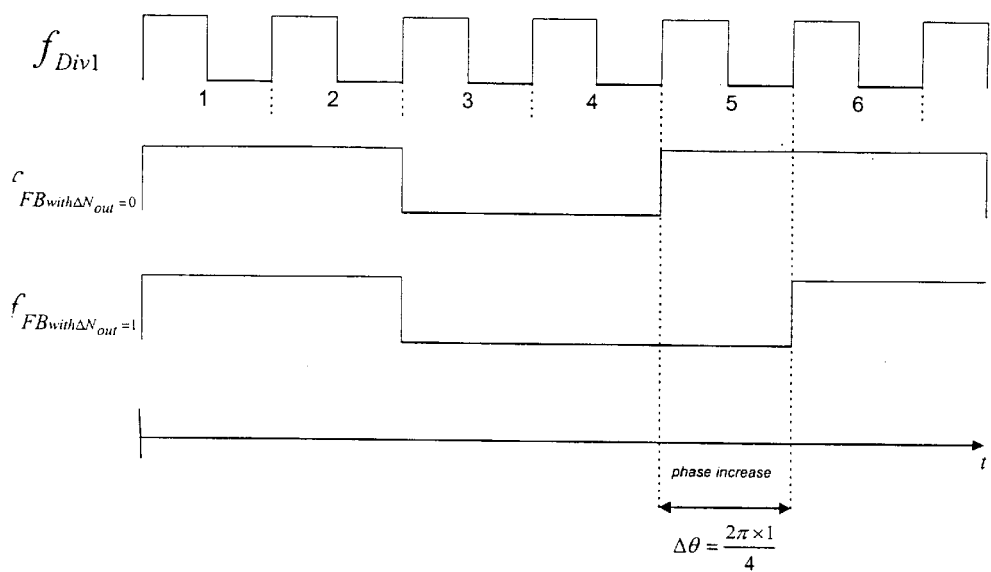
FIG. 2 shows a relation of the phases of the exemplary waveforms in the feedback path of the PLL of FIG. 1.

The effect on the feedback frequency $f_{FB}$ by adjusting $\Delta N_{out}$ is shown in FIG. 2. FIG. 2 shows an example of the relation of the wave diagrams for the frequency $f_{div1}$ and the feedback frequency $f_{FB}$ where $N_o=4$. As shown in FIG. 2, if the output of the discriminator block $\Delta N_{out}=0$, the divider 147 acts as an integer N divider that divides the frequency $f_{div1}$ by 4. However, if $\Delta N_{out}=1$, then the frequency divider 147 divides the frequency $f_{div1}$ by 5 but also produces a change in phase $\Delta \theta_{div2}$ equal to $$\frac{2\pi \times 1}{4}.$$

The change of phase $\Delta \theta_{div2}$ from frequency $f_{div1}$ to the feedback frequency $f_{FB}$ introduces a zero in the feedback path 102.

A comparison of the loop gains for a conventional PLL and the PLL 100 shows that the PLL 100 attenuates input jitter and preserves closed loop stability. For example, the loop gain $G_{PLL}$ of a conventional PLL may be expresses as follows:

$$G_{PLL}2\text{nd} = K_{PLL} \frac{(1+s/\omega_z)}{s^2} \quad (2^{nd} \text{ order loop});$$

$$G_{PLL}3\text{rd} = K_{PLL} \frac{(1+s/\omega_z)}{s^2(1+s/\omega_{p1})} \quad (3^{rd} \text{ order loop});$$

$$G_{PLL}4\text{th} = K_{PLL} \frac{(1+s/\omega_z)}{s^2(1+s/\omega_{p1})(1+s/\omega_{p2})} \quad (4^{th} \text{ order loop}),$$

where $K_{PLL}$ is the loop gain constant, $\omega_z$ is the frequency of a loop gain zero, and $\omega_p$ is the frequency of a loop gain pole.

The loop gain $G_{PLL}$ of the PLL 100, shown in FIG. 1 may be determined as the product of the individual gains of each element in the loop. Therefore, the loop gain may be expressed as $G_{PLL\ FIG.\ 1} = G_{pd} G_{fil} G_{vco} G_{div1} G_{div2}$. Substituting the values for each of the loop elements described above gives:

$$G_{PLL}Fig.1 = K_{PD}F(s) \frac{K_{vco}}{s} \frac{1}{R} \left( \frac{1}{N_o} + \frac{2\pi \Delta N_{out}}{N_o} \right).$$

Substituting for $\Delta N_{out}$ gives:

$$G_{PLL}Fig.1 = \frac{K_{PD}K_{vco}}{RN_o} \frac{F(s)}{s} \left( 1 + \frac{2\pi K_d s}{f_x} \right).$$

Simplifying the equation gives:

$$G_{PLL}Fig.1 = \frac{K_{PD}K_{vco}}{RN_o} \frac{F(s)}{s} \left( 1 + \frac{s}{\omega_z} \right)$$

where the frequency of the zero is expressed as $$\omega_z = \frac{f_x}{2\pi K_d}.$$

In addition, if the transfer function F(s) of the loop filter 120 is expressed as:

$$F(s) = \frac{1}{s(\tau_1)} \quad (2^{nd} \text{ order loop});$$

$$F(s) = \frac{1}{s(\tau_1)(1+s\tau_2)} \quad (3^{rd} \text{ order loop});$$

$$F(s) = \frac{1}{s(\tau_1)(1+s\tau_2)(1+s\tau_3)} \quad (4^{th} \text{ order loop});$$

then substituting for F(s) in the loop gain $G_{PLL}{}^{FIG.\ 1}$ equation for the PLL 100 in FIG. 1 gives:

$$G_{PLL^{Fig.1}} = \frac{K_{PD}K_{vco}}{RN_o\tau_1}\frac{(1+s/\omega_z)}{s^2} = K_{PLL}\frac{(1+s/\omega_z)}{s^2} \quad (2^{nd} \text{ order loop});$$

$$G_{PLL^{Fig.1}} =$$

$$\frac{K_{PD}K_{vco}}{RN_o\tau_1}\frac{(1+s/\omega_z)}{s^2(1+s/\omega_p)} = K_{PLL}\frac{(1+s/\omega_z)}{s^2(1+s/\omega_p)} \quad (3^{rd} \text{ order loop});$$

$$G_{PLL^{Fig.1}} = \frac{K_{PD}K_{vco}}{RN_o\tau_1}\frac{(1+s/\omega_z)}{s^2(1+s/\omega_{p1})(1+s/\omega_{p2})} =$$

$$K_{PLL}\frac{(1+s/\omega_z)}{s^2(1+s/\omega_{p1})(1+s/\omega_{p2})} \quad (4^{th} \text{ order loop});$$

As can be seen, the PLL 100 of FIG. 1 includes the same loop zero in the loop gain function as that of a conventional PLL, and therefore provides the same loop stability. However, the gain of the forward path is the product of the gains of the elements of the forward loop and may be expressed as: $G_{Foward}^{FIG.\ 1} = G_{pd}G_{fil}G_{vco}$.

Substituting the values for the forward loop gives:

$$G_{Forward}^{Fig.1} = K_{PD}F(s)\frac{K_{vco}}{s}.$$

Substituting for F(s) gives:

$$G_{Forward}^{Fig.1} = \frac{K_{PD}K_{vco}}{\tau_1 s^2} \quad (2^{nd} \text{ order loop});$$

$$G_{Forward}^{Fig.1} = \frac{K_{PD}K_{vco}}{\tau_1}\frac{1}{s^2(1+s/\omega_p)} \quad (3^{rd} \text{ order loop}); \text{ and}$$

$$G_{Forward}^{Fig.1} = \frac{K_{PD}K_{vco}}{\tau_1}\frac{1}{s^2(1+s/\omega_{p1})(1+s/\omega_{p2})} \quad (4^{th} \text{ order loop}).$$

As can be seen from the forward path gain equations, the numerator of each equation is a constant and does not contain a zero. As a result, the effect of the input jitter is attenuated as shown in FIG. 3.

Figure 3:
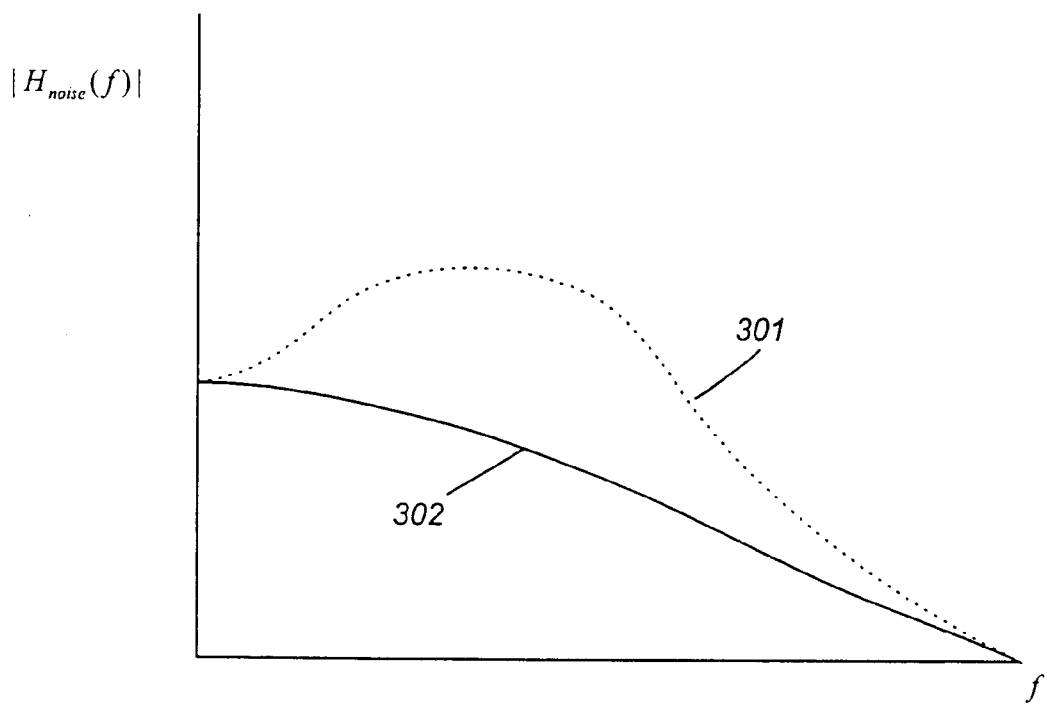
FIG. 3 is a comparison of the loop noise magnitude of a conventional PLL and the PLL of FIG. 1.

FIG. 3 shows the noise magnitude $|H_{noise}(f)|$ (e.g., including input jitter) of the PLL as a function of frequency. For example, a conventional third order PLL that has a zero produced by the loop filter has a noise transfer function expressed as:

$$H_{noise}(f) = \frac{K_{PLL}(1+s/\omega_z)}{s^3/\omega_{p1} + s^2 + K_{PLL}s/\omega_z + K_{PLL}}$$

The magnitude of the noise $|H_{noise}(f)|$ versus frequency for a conventional PLL is represented in FIG. 3 by curve 301. The power of the noise is represented by the area under the curve 301. As shown in FIG. 3, the magnitude for noise of a conventional PLL has a peaking response, which is caused by the zero introduced by the loop filter in the forward path.

In contrast, the function for noise $H_{noise}(f)$ of a third order PLL 100 of FIG. 1 with a zero produced in the feedback path (e.g., by the block 145) may be expressed as:

$$H_{noise}(f) = \frac{K_{PLL}}{s^3/\omega_{p1} + s^2 + K_{PLL}s/\omega_z + K_{PLL}}$$

The magnitude of noise $|H_{noise}(f)|$ versus frequency for the PLL 100 of FIG. 1 is represented in FIG. 3 by curve 302. Comparing the noise transfer function equations, the denominators of the equations for a conventional PLL and the PLL 100 of FIG. 1 are the same. However, with the elimination of the zero from the forward path, the numerator of the noise transfer function for the PLL 100 of FIG. 1 is a constant. As a result, the peaking response of curve 301 may be reduced or eliminated, and the area under curve 302 is smaller than that under curve 301. Therefore, the power of the noise in the forward path of PLL 100 is attenuated.

The elements used to introduce the zero in the feedback path (e.g., the block 145 and the divider 147) may be implemented digitally. Therefore, the PLL 100 may be implemented using, for example, a single supply, low-voltage, digital complementary metal oxide semiconductor (CMOS) process. As a result, the PLL 100 may be manufactured using process invariant procedures. In addition, the PLL 100 incurs no significant penalty for power dissipation associated with the additional circuitry (e.g., the discriminator block) that corresponds to placing a zero in the feedback path 102. The PLL 100 also provides the loop designer with excellent control over the placement of the loop zero in the closed loop transfer function. For example, the placement of the zero may be easily set or adjusted by varying the reference frequency $f_x$ and/or the discriminator block gain constant $K_d$.

Figure 4:
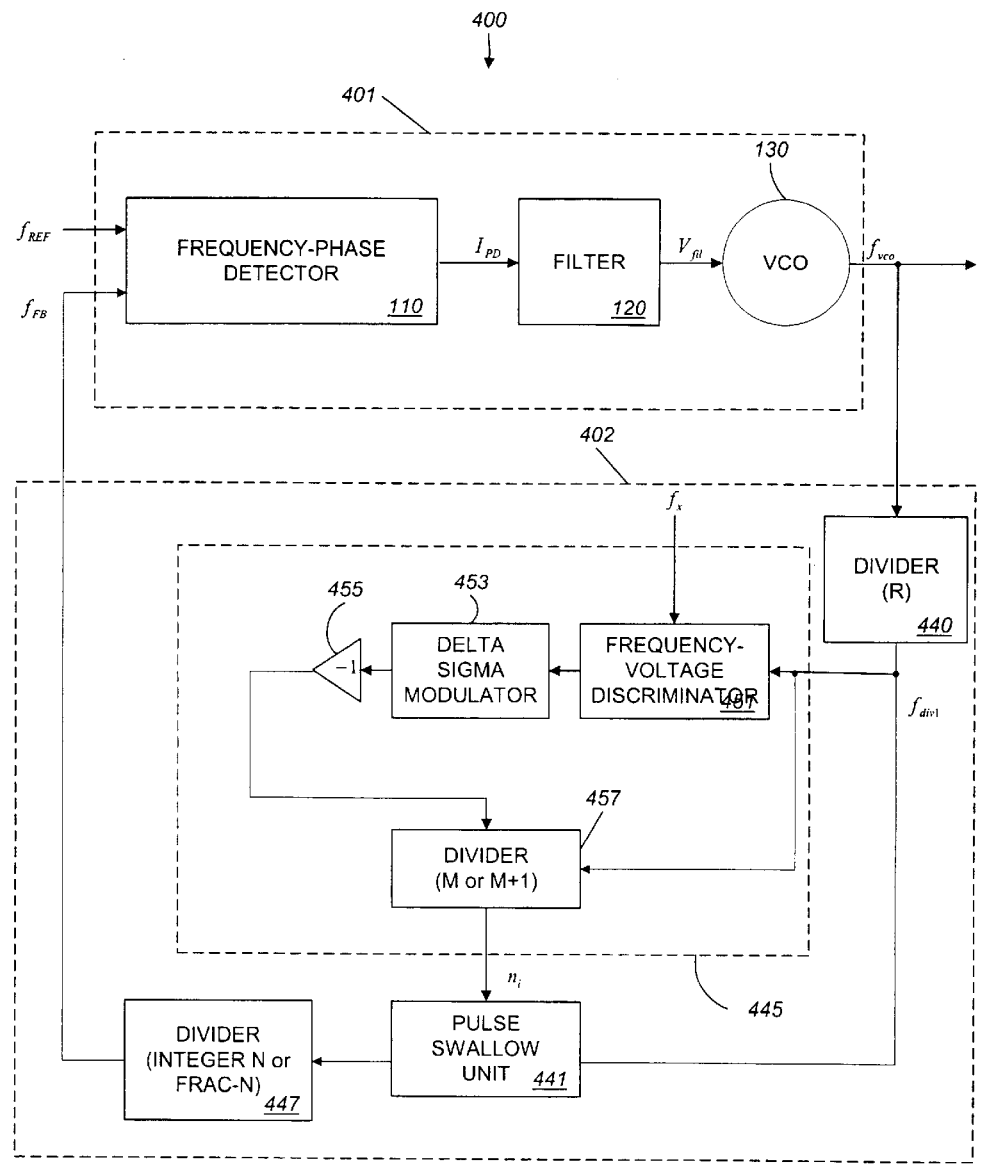
FIG. 4 is an exemplary block diagram of a PLL.

FIG. 4 shows another exemplary PLL 400 that attenuates input jitter and has a zero in the feedback path. As shown in FIG. 4, the PLL 400 may include a frequency-phase detector 110, a loop filter 120, and a VCO 130 in the forward path 401. The feedback path 402 may include a divider 440, a pulse swallow unit 441, a block 445, and a divider 447.

The block 445 includes a frequency-to-voltage discriminator 451, a delta-sigma modulator 453, an inverter 455, and a dual modulus divider 457. The frequency $f_{div1}$ output from the first divider 440 is input to a phase detector block 451 that compares the phase of the signal $f_{div1}$ with a reference frequency, for example, an input clock $f_x$, to generate an error voltage that is a function of the phase-error between $f_{div1}$ and $f_x$. The error voltage from the discriminator 451 is input to the delta-sigma modulator 453. The delta-sigma modulator 453 generates an output (i.e., a ±1) based on the error voltage. The output of the delta-sigma modulator 453 is input to an inverter 455 to generate the control input $M_i$.

The control input $M_i$ is used to control the dual modulus divider 457. The dual modulus divider 457 outputs a control pulse $n_i$ once every M or M+1 cycles of the signal; $f_{div1}$ where M is an integer based on the control input $M_i$. The control pulse $n_i$ is used to control the pulse swallow unit 441.

The pulse swallow unit may be used to adjust the phase of the signal $f_{div1}$. If the control pulse $n_i$ is high, the transition of input signal $f_{div1}$ (i.e., the triggering of an edge of the frequency waveform) is delayed. As a result, the phase of the signal $f_{div1}$ is adjusted before it is input to the divider 447.

As a result of the phase adjustment to $f_{div1}$, the block 445 in combination with the pulse swallow unit introduces a zero in the feedback path 402 to provide stability in the closed loop transfer function of the PLL. For example, the pulse swallow unit 441 multiplies the loop transfer function by a factor of $$\left(1 - \frac{1}{n_i}\right),$$

where $n_i$ (i.e., the control pulse) is the division index output from the dual modulus divider 457. Since the index $n_i$ is derived from the block 445, its gain may be expressed as $$\frac{K_d}{s}$$

where $K_d$ is the gain constant of the block 445. As a result, the loop gain transfer function is multiplied by $$\left(1 + \frac{s}{K_d}\right)$$

to provide a loop stabilizing zero. However, the gain of the forward path of PLL 400 remains:

$$G_{Forward^{Fig.4}} = \frac{K_{PD}K_{vco}}{\tau_1 s^2} \quad (2^{nd} \text{ order loop});$$

$$G_{Forward^{Fig.4}} = \frac{K_{PD}K_{vco}}{\tau_1} \frac{1}{s^2(1+s/\omega_p)} \quad (3^{rd} \text{ order loop});$$

$$G_{Forward^{Fig.4}} = \frac{K_{PD}K_{vco}}{\tau_1} \frac{1}{s^2(1+s/\omega_{p1})(1+s/\omega_{p2})} \quad (4^{th} \text{ order loop}).$$

As a result, the numerator is a constant and the phase noise of the forward path is not amplified. In addition, the closed loop transfer function is stable due to the zero introduced to the feedback path 402.

Figure 5:
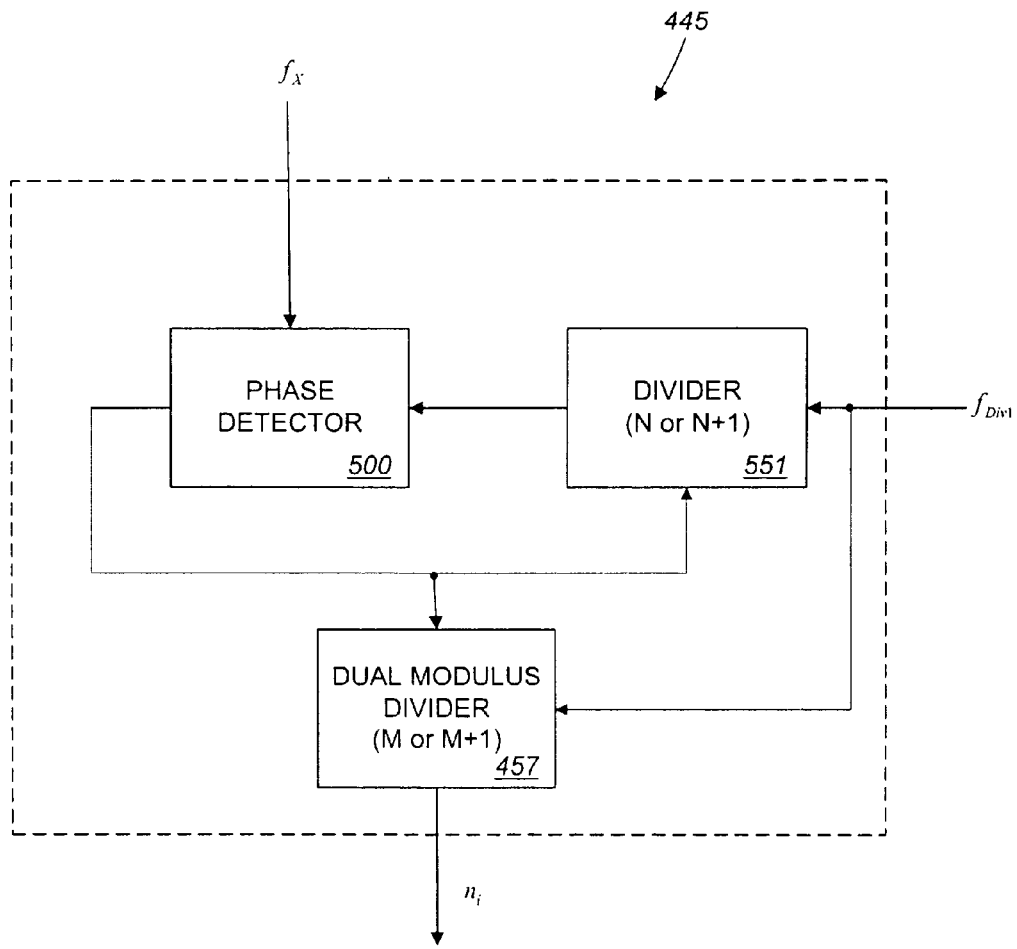
FIG. 5 is an exemplary block diagram of a discriminator block for the PLL of FIG. 4.

As shown in FIG. 5, another exemplary block 445 may combine frequency to voltage conversion and delta sigma modulation. The block 445 may be used in the PLL 400 of FIG. 4 may include a phase detector 500 (e.g., a frequency-to-voltage converter) and two dual modulus dividers 551 and 457. The frequency $f_{div1}$ is input to a dual modulus divider 551. The dual modulus divider 551 divides the frequency down by one of two moduli (N or N+1). The divided frequency is input to the discriminator 500, and is compared with a reference frequency $f_x$, for example, a clock signal. According to one implementation, the reference frequency $f_{ref}$ may be used as the reference frequency $f_x$. The output of the discriminator 500 is used as the control input or division index of the two dual modulus dividers 457 and 551. The dual modulus divider 457 outputs a control pulse $n_i$ once every M or M+1 cycles of the frequency $f_{div1}$, as described above.

In addition to attenuating noise in the forward path by placing the loop-stabilizing zero in the feedback path, the circuits of FIGS. 4 and 5 may be implemented using a single supply, low-voltage, digital CMOS process. As a result, the PLL 400 may be manufactured using a process invariant procedure, and the PLL 400 incurs no significant penalty for power dissipation associated with the additional circuitry of the block 445. The PLL 400 also provides the loop designer with excellent control over the placement of the loop zero.

A number of exemplary implementations have been described. Nevertheless, it will be understood that various modifications may be made. For example, different types of phase comparators, loop filters, VCOs, and dividers may be used in the PLL. In addition, suitable results still could be achieved if the steps of the disclosed techniques were performed in a different order and/or if components in a disclosed architecture, device, or circuit were combined in a different manner and/or replaced or supplemented by other components. Accordingly, other implementations are within the scope of the following claims.

What is claimed is:

1. A phased-locked loop (PLL) comprising:
   a comparator configured to compare a reference signal and a feedback signal and to generate an error signal;
   a filter configured to output a voltage based on the error signal;
   a voltage controlled oscillator (VCO) configured to generate an output frequency based on the filter output voltage; and
   a feedback path circuit configured to generate the feedback signal as a function of the output frequency and to introduce a zero in a loop gain transfer function of the PLL.

2. The PLL of claim 1 further comprising a forward loop path circuit wherein the forward path circuit includes the comparator, the filter, and the VCO and is configured to introduce no zeros in a forward path transfer function.

3. A phase-locked loop (PLL) comprising:
   a forward path circuit to generate an output signal at an output frequency that is based on a comparison of a reference signal and a feedback signal; and
   a feedback path circuit to generate the feedback signal as a function of the output frequency and to introduce a zero in a loop gain transfer function of the PLL, the feedback path circuit including a discriminator block to compare a third frequency based on the output frequency with a reference clock to generate a control signal.

4. The PLL of claim 3 wherein the control signal corresponds to a change in a phase of the third frequency.

5. The PLL of claim 3 wherein the feedback path circuit includes a divider that is configured to adjust a phase of the third frequency, according to the control signal.

6. The PLL of claim 3 wherein the discriminator block includes a discriminator configured to compare the third frequency, and the reference clock to generate a frequency-error signal, a delay unit configured to receive the frequency-error signal, and an adder configured to determine the difference between an output of the discriminator and an output of the delay unit.

7. The PLL of claim 6, wherein the feedback path circuit includes a divider configured to adjust a the phase of the third frequency, according to the control signal.

8. The PLL of claim 3 wherein the feedback path circuit includes a pulse swallow unit configured to adjust a phase of the third frequency, according to the control signal.

9. The PLL of claim 8 wherein the discriminator block includes a divider configured to generate the control signal, a discriminator configured to compare the third frequency, and the reference clock to generate a frequency-error signal, and a delta sigma modulator configured to generate a divide control signal for the divider based on the frequency-error.

10. The PLL of claim 3 wherein the discriminator block includes a first divider configured to generate the control signal, a second divider configured to divide the third frequency, and a discriminator configured to compare an output of the first divider and the reference clock to generate a divider control signal that controls the first and the second dividers.

11. The PLL of claim 1 wherein the PLL is implemented using single supply, complementary metal oxide semiconductor components.

12. The PLL of claim 3 wherein the third frequency includes the output frequency.

13. A phase-locked loop (PLL) comprising:
   a forward path circuit configured to receive a reference clock and to output a first frequency; and
   a feedback path circuit configured to output a second frequency based on the first frequency and to introduce a zero in a loop gain transfer function of the PLL.

14. The PLL of claim 13 wherein the PLL is implemented using a single supply, complementary metal oxide semiconductor components.

15. A phase-locked loop (PLL) comprising:
a forward path circuit configured to receive a reference clock and to output a first frequency; and
a feedback path circuit configured to output a second frequency based on the first frequency using a discriminator block to introduce a zero in a loop gain transfer function of the PLL.

16. A phase-locked loop (PLL) comprising:
a forward path circuit configured to receive a reference clock and to output a first frequency; and
a feedback path circuit configured to output a second frequency based on the first frequency and to introduce a zero in a the loop gain transfer function of the PLL using a discriminator block that compares a third frequency based on the first frequency and the reference clock to generate a control signal.

17. The PLL of claim 16 wherein the control signal corresponds to a change in a phase of the third frequency.

18. The PLL of claim 16 wherein the feedback path circuit includes a divider that is configured to adjust a phase of the third frequency, according to the control signal.

19. The PLL of claim 16 wherein the discriminator block includes a discriminator configured to compare the third frequency, and the reference clock to generate a frequency-error signal, a delay unit configured to receive the frequency-error signal, and an adder configured to determine the difference between an output of the discriminator and an output of the delay unit.

20. The PLL of claim 19, wherein the feedback path circuit includes a divider configured to adjust a phase of the third frequency, according to the control signal.

21. The PLL of claim 16 wherein the feedback path circuit includes a pulse swallow unit configured to adjust a phase of the third frequency, according to the control signal.

22. The PLL of claim 21 wherein the discriminator block includes a divider configured to generate the control signal, a phase detector configured to compare the third frequency, and the reference clock to generate an error signal, and a delta sigma modulator configured to generate a divide control signal for the divider based on the reference clock generated error signal.

23. The PLL of claim 16 wherein the discriminator block includes a first divider configured to generate the control signal, a second divider configured to divide the third frequency, and a discriminator configured to compare an output of the first divider and the reference clock to generate a divider control signal that controls the first and the second dividers.

24. The PLL of claim 16 wherein the third frequency includes the first frequency.

25. A method comprising:
receiving a reference clock in a forward path circuit of a phase-locked loop (PLL);
outputting a first frequency from the forward path circuit of the phase-locked loop (PLL);
outputting a second frequency based on the first frequency in a feedback path circuit of the PLL; and
introducing in the feedback path circuit of the PLL a zero in a loop gain transfer function of the PLL.

26. A method comprising:
receiving a reference clock in a forward path circuit of a phase-locked loop (PLL);
outputting a first frequency from the forward path circuit of the phase-locked loop (PLL);
outputting a second frequency based on the first frequency in a feedback path circuit of the PLL; and
using a discriminator block to introduce in the feedback path circuit of the PLL a zero in a loop gain transfer function of the PLL.

27. A method comprising:
receiving a reference clock in a forward path circuit of a phase-locked loop (PLL);
outputting a first frequency from the forward path circuit of the phase-locked loop (PLL);
outputting a second frequency based on the first frequency in a feedback path circuit of the PLL;
comparing a third frequency based on the first frequency with the reference clock to generate a control signal; and
introducing in the feedback path circuit of the PLL a zero in the loop gain transfer function of the PLL.

28. The method of claim 27 wherein generating the control signal includes generating a control signal that corresponds to a change in a phase of the third frequency.

29. The method of claim 27 further comprising comparing the third frequency, and the reference clock to generate a frequency-error signal, delaying the frequency-error signal, and determining the difference between frequency-error signal and the delayed frequency-error signal.

30. The method of claim 29 wherein generating the frequency error-signal includes controlling a divider based on the frequency-error signal.

31. The PLL of claim 27 wherein the third frequency includes the first frequency.

* * * * *